Figure 1A:
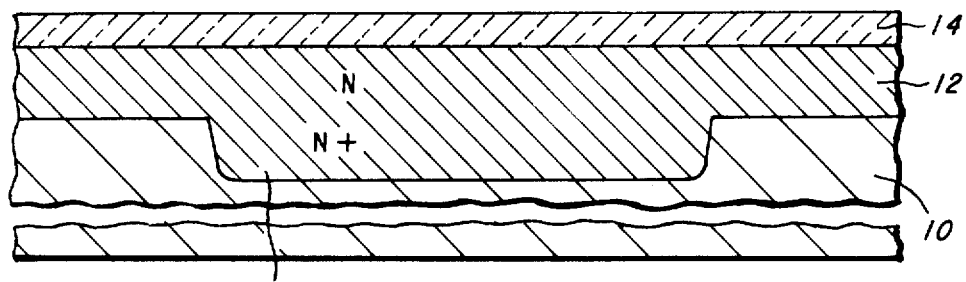

United States Patent [19]

Sloan, Jr.

[11] 3,933,528

[45] Jan. 20, 1976

[54] PROCESS FOR FABRICATING INTEGRATED CIRCUITS UTILIZING ION IMPLANTATION

[75] Inventor: Benjamin Johnston Sloan, Jr., Richardson, Tex.

[73] Assignee: Texas Instruments Incorporated, Dallas, Tex.

[22] Filed: July 2, 1974

[21] Appl. No.: 485,199

[52] U.S. Cl. .................................. 148/1.5; 357/91
[51] Int. Cl.² ...................................... H01L 21/265
[58] Field of Search .................................. 148/1.5

[56] References Cited
UNITED STATES PATENTS

| | | | |
|---|---|---|---|
| 3,756,861 | 9/1973 | Payne et al. | 148/1.5 |
| 3,793,088 | 2/1974 | Eckton, Jr. | 148/1.5 |

*Primary Examiner*—L. DeWayne Rutledge
*Assistant Examiner*—J. M. Davis
*Attorney, Agent, or Firm*—Harold Levine; James T. Comfort; Gary C. Honeycutt

[57] ABSTRACT

A self-aligning process for fabrication of integrated circuits utilizing ion implantation to effect doping. A composed masking technique is used to define self-aligned areas in a silicon oxide layer for definition of isolation, base, resistor and collector contact regions. Only two oxide removal steps are required for isolation through emitter process steps, and the process uses the silicon oxide layer and photoresist material for implantation masking. Formation of the emitter region by ion implantation and by diffusion are described.

10 Claims, 9 Drawing Figures

PROCESS FOR FABRICATING INTEGRATED CIRCUITS UTILIZING ION IMPLANTATION

This invention relates to a method of fabricating semiconductor devices, especially integrated circuit structures utilizing ion implantation techniques.

Typically, five or more photomasking operations are used to define apertures in a masking layer overlying a surface of a semiconductor substrate for formation of semiconductor regions and interconnections therebetween during fabrication of an integrated circuit. Typically (but not necessarily), the silicon oxide and the aperture definition steps are referred to as O. R. steps. The alignment or registration of the various mask levels with respect to each other have to be controlled within critical tolerances in order to ensure proper operation of the end device, since alignment errors can be cumulative. Consequently, it is very desirable to minimize, and preferably to eliminate, the number of manual alignment operations that are required. Improvements in this direction have been accomplished in relation to integrated circuits manufactured using diffusion techniques by use of masking layers formed on the semiconductor surface which have different chemical etching characteristics, e.g., silicon dioxide and silicon nitride. All necessary mask apertures are formed in the underlying masking layer, e.g., of silicon dioxide, which is then covered with a second masking layer, e.g., silicon nitride. Photomasks can then be used to selectively open up areas of the second masking layer which are larger than the corresponding apertures in the first masking layer so that critical alignment thereof is not required. Consequently, the spacing between regions diffused into the semiconductor substrate is determined not by the registration between the different mask levels but by the accuracy of the patterning defined by the first masking layer. One example of such a so-called "composed" masking technique is described in copending U.S. patent application Ser. No. 191,666, filed Oct. 22, 1971 by Wilton L. Workman et al. and assigned to the Assignee of the present application.

It is an object of the present invention to provide an improved semiconductor device fabrication process suitable for use with ion implantation techniques and wherein accurate spacing between implanted regions may be achieved.

It is also an object of the invention to provide an improved and relatively simple method of fabricating semiconductor devices using ion implantation techniques.

Accordingly, the present invention provides, in a method for fabricating a semiconductor device including a semiconductor substrate having a mask definition layer on one surface thereof, the steps of using a single patterned layer located on the insulating layer to delineate a plurality of spaced, self-aligned areas in the mask definition layer. Dopant ions are then implanted into the semiconductor substrate simultaneously through at least first and second of the self-aligned areas while other ones of said areas are covered with implantation barrier material, suitably photoresist material, to prevent ion implantation therethrough, and the implantation barrier material is subsequently completely removed from the mask definition layer. Suitably, the mask definition layer is an insulating layer, and in order to provide desired ion implantation profiles, the self-aligned areas may comprise locally thinned areas in the insulating layer.

In a specific embodiment of the present invention, in fabricating a semiconductor device, e.g., an integrated circuit, having a semiconductor layer of one conductivity type and an underlying semiconductor region of opposite conductivity type, a mask definition layer of insulating material is formed over a surface of the semiconductor layer of one conductivity type and a patterned layer is formed on the insulating layer. Portions of the insulating layer are then removed in areas delineated by the patterned layer to open a closed contour aperture in the insulating layer and first, second and third self-aligned spaced apertures through the insulating layer which are surrounded by the closed contour aperture. Ions of conductivity type opposite from that of the semiconductor layer are then implanted through the closed contour aperture to form a region extending completely through the semiconductor layer which defines an isolation region, the said first, second and third apertures being covered with implantation barrier material, preferably photoresist material, to prevent implantation of ions through those apertures. The insulating layer is then uncovered and a relatively thin layer of insulating material is formed on surface portions of the semiconductor layer within the first, second and third apertures. The relatively thin insulating layer in the first aperture is then covered with implantation barrier material to prevent implantation of ions therethrough, and ions of said opposite conductivity type are implanted into the semiconductor layer through the relatively thin layers of insulating material in the second, third and closed contour apertures. The thin insulating layers in the first and second apertures are then covered with implantation barrier material to prevent implantation of ions therethrough and further dopant ions of said opposite conductivity type implanted through the thin insulating layers in the third and closed contour apertures, thereby reducing the sheet resistance of the third implanted region. If desired, the third aperture may be covered with implantation barrier material during implantation of the second region. The region of the semiconductor layer enclosed by the isolation region may thus provide a collector region for a transistor, the base region of which is provided by the third implanted region, while the second region defines an implanted resistor. By exposing surface areas of the semiconductor layer beneath the first aperture and over a limited area of the third (base) implanted region, impurities of said one conductivity type may be introduced into the semiconductor layer to define, respectively, a collector contact region and an emitter region for the transistor.

Preferably such method is practiced using a silicon substrate having a silicon oxide insulating layer thereon to provide the mask definition layer and using photoresist masking material to provide the said patterned layer and as the implantation barrier material.

Figure 1B:
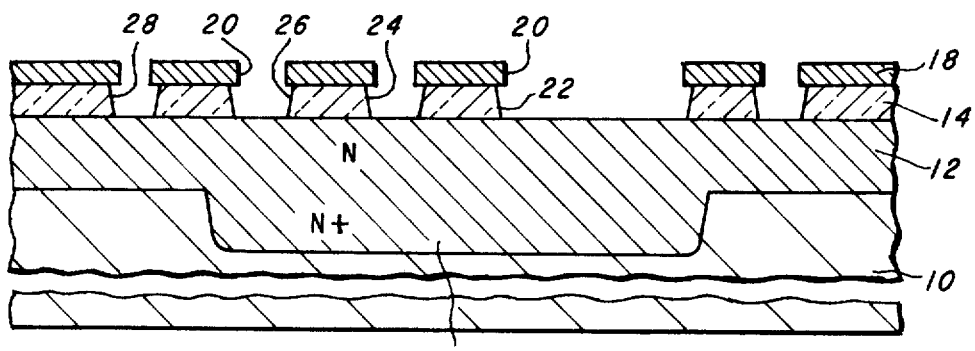
Figure 1C:
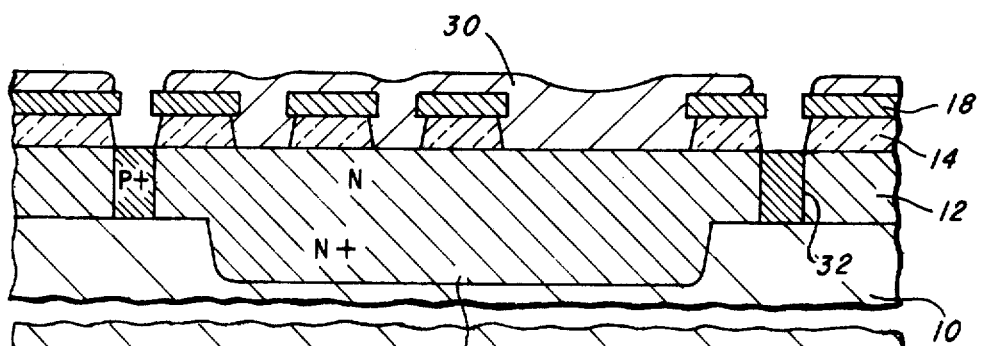
Figure 1D:
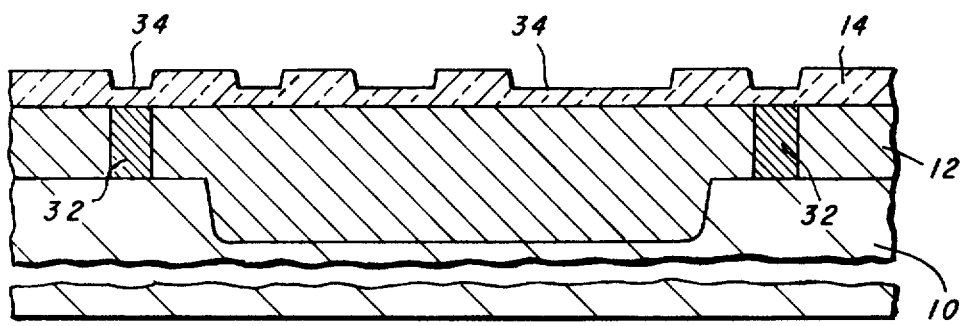
Figure 1E:
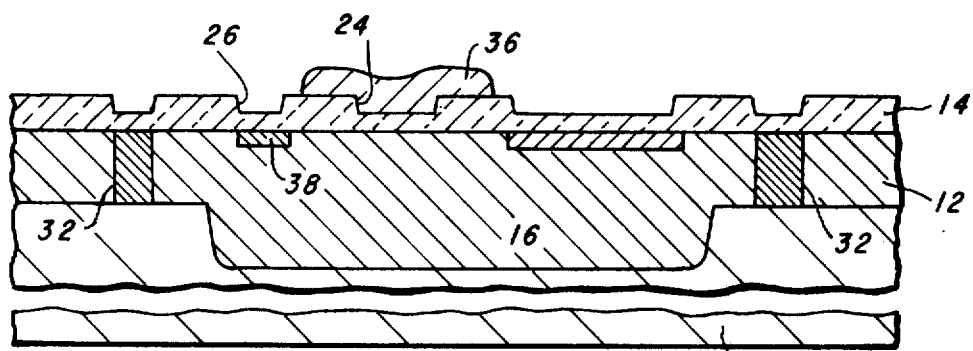
Figure 1F:
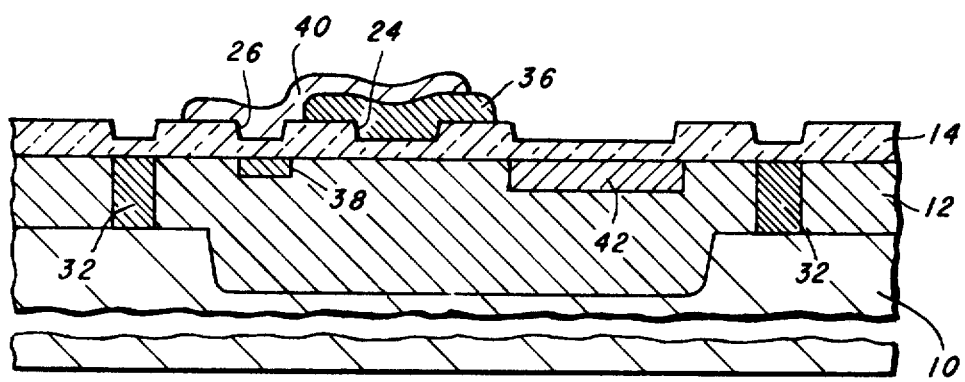
Figure 1G:
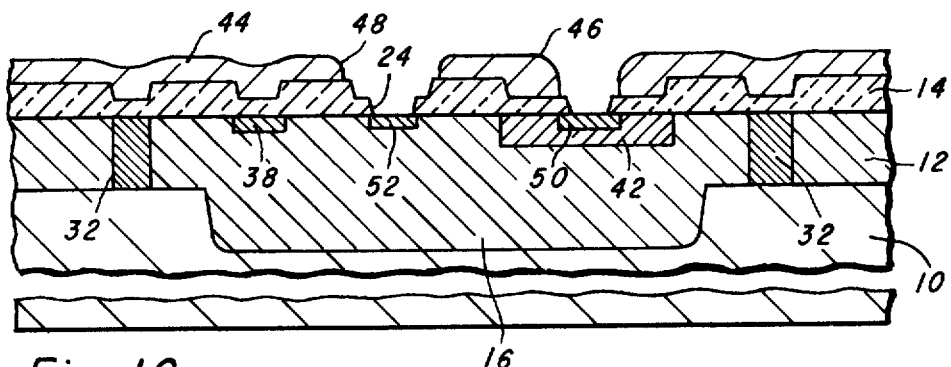
Figure 1H:
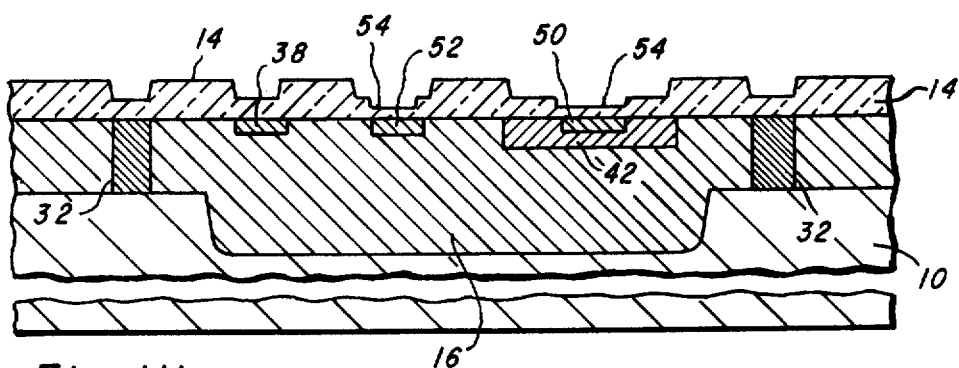

Further objects and advantages of the present invention will be apparent upon reading the following detailed description of an illustrative embodiment thereof in conjunction with the drawings wherein:

FIGS. 1A–1H show a sequence of processing steps carrying out an embodiment of the present invention and FIG. II shows a variation of processing steps shown in FIG. 1H.

As starting material, a p-type silicon substrate 10 suitably having a resistivity of 10–20 ohm-cm, may be used having an n-type epitaxial layer 12, typically about 1–2 microns thick with a resistivity of 0.5 ohm-cm, and an insulating layer 14, e.g., silicon oxide, formed on the upper surface of the epitaxial layer 12 suitably to a thickness of about 6000A. The insulating layer 14 is patterned to define areas of regions to be formed in the epitaxial layer 12, and functions as a mask during formation of such regions, as will be explained. A buried n+type region 16, suitably having a sheet resistivity of about 50 ohms per square or less may be formed in the substrate 10 beneath the epitaxial layer 12 prior to formation of the epitaxial layer. The buried region 16 is not essential to a method embodying the present invention but is typically included in a transistor structure with reference to which the method will be described. Such a structure is shown in FIG. 1A.

A patterned layer 18 of photoresist is formed over the surface of the insulating layer 14 as shown in FIG. 1B, using conventional methods to define apertures 20 therein corresponding to surface areas of a base region, a collector contact region, a resistor region and an isolation region subsequently to be defined in the epitaxial layer 12. Example of some suitable photoresist materials are KODAK Microresist 747, Hunt Chemical Co., Waycoat III resist and Shipley AZ1350H resist.

Typically, the base and collector contact apertures may be circular or rectangular, the resistor aperture may be an elongated rectangle or zig-zagged, and the isolation aperture will follow a closed contour area for example circular or rectangular. The base region, collector contact and resistor apertures are located immediately above the buried region 16 while the isolation region aperture circumscribes the buried region 16. Using conventional etching techniques, areas of the insulating layer 14 are removed to define apertures therein registered with the apertures 20 in the patterned layer 18. As shown in FIG. 1B, there are thus formed in the insulating layer, a base region aperture 22, a collector contact aperture 24, a resistor region aperture 26, and an isolating region aperture 28. It will be appreciated that since the apertures 22, 24, 26 and 28 are formed at the same time using a single masking step, the relative spacings therebetween can be closely controlled and critically close spacings reliably achieved with a high degree of accuracy.

Leaving the patterned layer 18 in place, further photoresist material 30 is applied to cover the apertures 22, 24 and 26 in the insulating layer 14, leaving the isolation region aperture 28 uncovered, as shown in FIG. 1C. P-type impurity ions, e.g., boron ("B$^+$), are then implanted into the surface area of the epitaxial layer 12 exposed by the isolation aperture 28 using an ion implantation dosage of about 1–2 × 10$^{15}$ cm$^{-2}$ at a beam energy of approximately 200 keV to define a p-type isolation region 32 extending completely through the epitaxial layer 12. The thicknesses of the photoresist layer 18 and of the photoresist material 30 are selected to provide an effective barrier against implantation of ions into other areas of the epitaxial layer and suitably a minimum thickness of about 1 micron has been found adequate.

The photoresist layers 18 and 30 are then removed and thin silicon oxide layers 34 are formed on the epitaxial layer surface within the apertures 22, 24, 26 and 28 using thermal growth techniques at a temperature suitably of 950°C which suitably may be about 2000A. The resultant structure is shown in FIG. 1D.

The collector contact aperture 24 is then covered with an implant barrier layer of photoresist material 36. P-type impurity ions, suitably boron ("B$^+$), are then implanted into the epitaxial layer through the reduced thickness oxide layers 34 in the apertures 22, 26 and 28, the photoresist layer 36 and the thick silicon oxide layer 14 providing a barrier against ion implantation into other areas of the epitaxial layer. The ions implanted through the aperture 26 define a resistor region 38 in the epitaxial layer (implantation of p-type ions through the aperture 22 is not essential in formation of the base region of the transistor and may be omitted if so desired); and implantation of further p-type ions through the aperture 28 reduces the sheet resistance at the surface of the isolation region 32. In carrying out this implantation step, an implantation dosage of approximately 10$^{13}$ cm$^{-2}$ and a beam energy of about 80 keV are used.

A further implantation barrier layer 40, again suitably a layer of photoresist, is formed to cover the resistor aperture 26 in the insulating layer 14. Further p-type ions, again suitably boron ("B$^+$) are implanted into the epitaxial layer through the apertures 22 and 28, with the silicon oxide layer 14 and photoresist layers 36 and 40 providing a barrier against implantation of ions into other portions of the epitaxial layer 12. During this implantation step, an implantation dosage of about 10$^{14}$cm$^{-2}$ at a beam energy of about 80 keV is used. This implantation step decreases the sheet resistance within the aperture 22 to define a base region 42 for the transistor, and further decreases the sheet resistance at the surface of the isolation region 32. The resultant structure is shown in FIG. 1F.

At this stage of fabrication, as shown in FIG. 1F, there has been formed a resistor region 38 having a relatively high sheet resistance, a base region 42 having a lower sheet resistance, and an isolation region 32 (which penetrates completely through the epitaxial layer due to the higher energy used during the isolation implant) all as required to obtain desired functional characteristics associated with those regions as is known in the art.

The resistor region 38 may be formed to extend from the base region 42 or as a distinct, separate region in which case it may be located in the same or a different isolated pocket. In either case, a localized contact area or areas of the resistor region are also doped with impurity ions during implantation of the base region 42 (the associated apertures in the silicon oxide layer 14 not being shown in the drawings) to provide localized areas of reduced sheet resistance to facilitate making metal ohmic contacts thereto.

By implanting ions to define the resistor region 38 and the base region 42 through the thin silicon oxide layers 34 in the apertures 22 and 26, a suitable impurity profile extending depthwise into the epitaxial layer 12 is achieved, with a maximum impurity concentration at approximately the interface between the epitaxial layer 12 and the reduced thickness silicon oxide layers 34.

The structure as shown in FIG. 1F is now ready for further processing to define an emitter region within the base region 42 and a collector contact region beneath the aperture 24 and these regions may be formed by ion implantation or diffusion techniques as desired.

To proceed using ion implantation techniques, a photoresist layer 44 is provided over the surface of the silicon oxide layer 14 and patterned to define an aperture 46 corresponding to the desired configuration of the emitter region to be formed, the location of the aperture being closely controlled so that the emitter region is very precisely located within the base region 42, and an aperture 48 which uncovers the collector contact aperture 24 but otherwise need not be precisely positioned. Thus the collector contact is "composed" but the emitter is not. The collector contact aperture 26 included on the composed level so that the oxide thicknesses at this etch step are the same. The thin oxide layers 34 are selectively etched from the collector contact aperture 24 and over an area of the base region aperture 22 corresponding to the aperture 46. The silicon oxide layer 14 is uncovered by removing all photoresist material and N-type dopant ions are then introduced into the uncovered areas of the epitaxial layer to define an emitter region 50 and a collector contact region 52, implantation into other areas of the epitaxial layer being blocked by the silicon oxide layer 14. In this step, arsenic ($A_s$) ions are preferably used as the n-type impurity (although Phosphorous also may be used) and implanted using an implantation dosage of about $5 \times 10^{15}$ cm$^{-2}$ at a beam energy of about 60 keV. The structure is subjected to heat treatment at about 900°–1000°C to anneal the implanted regions and form an oxide layer 54 over the emitter region 50 and collector contact region 52 as shown in FIG. 1H.

To form the emitter region 50 and collector contact region 52 using diffusion techniques, the procedure as described with reference to FIG. 1G remains the same. This structure is then subjected to an n-type dopant atmosphere, typically phosphorus at a diffusion temperature of 950°C to define the emitter region 50 and the collector contact region 52. This diffusion process also serves to effect the required annealing of the implanted regions and results in formation of the silicon oxide areas 54.

Figure 1I:
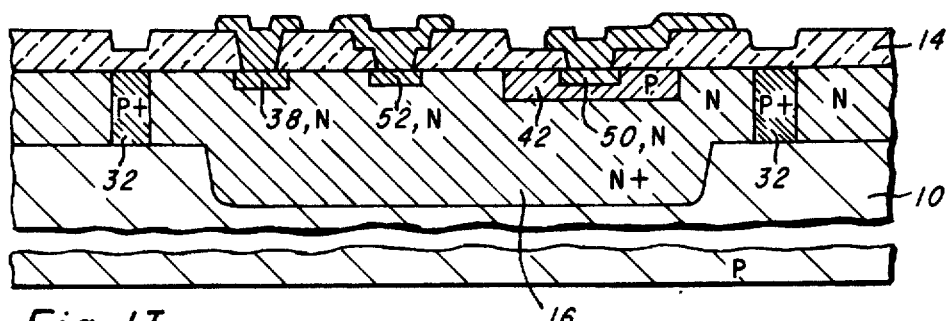

The resultant structure as shown in FIG. 1H is now ready for application of metal contacts and interconnections on the silicon oxide layer 14 involving masking and selective etching to uncover contact areas of the emitter region 50, of the base region 42 (not shown), of the resistor region 38, of the collector contact region 50 and if desired of the isolation region 32 (not shown; application of a metal layer over the surface of the silicon oxide layer 14 extending into contact with the uncovered areas of the epitaxial layer 12 and definition of required lead patterns to form respective leads as shown in FIG. 1I, extending into ohmic contact with the emitter region 50, collector contact region 52, resistor region 38 as well as a lead (not shown) to the base region 42.

In producing a structure as shown in FIG. 1H or 1I, it will be appreciated that only three (or four including definition of the N+ buried region 16) oxide removal steps have been required and that most critically spaced areas have been defined by a single masking step in an initial masking layer of silicon oxide so that these regions when formed are self-aligned. The required masking during the implantation steps is achieved using conventional photoresist materials of reasonable thickness, thereby simplifying and reducing the cost of the processing procedures.

The present invention is not restricted to use of silicon substrates and is applicable to other semiconductor materials, e.g., Ge. and compound semiconductors.

Also, although it is preferred to use silicon oxide as the surface insulating layer since this simplifies the processing procedure, other materials, e.g., silicon nitride, could be used.

It is also to be appreciated that circuit elements other than transistors may also be fabricated during the above-described process. As already mentioned, resistors can be formed in one or more separate isolated regions. Diodes normally would be provided from a transistor structure, shorting together two junctions and using the remaining junction to provide the diode as known in the art.

What is claimed is:
1. A method of fabricating a semiconductor device having a semiconductor substrate with a surface of one conductivity type on which is disposed an insulating layer, including the steps of
   a. forming a patterned layer on said insulating surface, said patterned layer having defined therein a plurality of critically spaced apertures;
   b. removing at least a portion of the thickness of said insulating layer in areas defined by said apertures in said patterned layer to define self-aligned control areas in said insulating layer;
   c. covering at least a first one of said control areas in said insulating layer by barrier material to prevent ion implantation therethrough and implanting dopant ions of conductivity type opposite to that of said semiconductor surface through at least second and third of said control areas to define first and second regions of said opposite conductivity type in said semiconductor surface;
   d. covering said second control area with barrier material to prevent ion implantation therethrough and implanting further dopant ions of said opposite conductivity type into said first region to reduce the sheet resistivity of said first region;
   e. introducing impurities of said one conductivity type into a reduced area of said first region to form therein a third region of said one conductivity type, and through a third one of said control areas into a further area of said semiconductor surface to form a fourth region of said one conductivity type.

2. A method according to claim 1, wherein said first region of opposite conductivity type defines a base region for a transistor and is formed in a region of said semiconductor surface defining a collector region for said transistor, wherein said third region of said one conductivity type defines an emitter region for said transistor, wherein said first region of opposite conductivity type defines a resistor, and wherein said fourth region defines a collector contact region.

3. A method according to claim 1, wherein said step (b) is accomplished by delineating apertures extending completely through said insulating layer to expose areas of said substrate surface in registration with said patterned layer apertures, and forming an insulating layer of reduced thickness on each of said exposed areas of said substrate surface.

4. In a method of fabricating a semiconductor device having a semiconductor substrate comprising a surface layer of one conductivity type and an underlying layer of opposite conductivity type, the steps of
   a. forming an insulating layer on the surface of said layer of one conductivity type;
   b. forming a patterned layer on said insulating layer and removing portions of said insulating layer over areas delineated by self-aligned apertures in said patterned layer, said areas including a closed contour area and a plurality of further apertures surrounded by said closed contour area;

c. covering said further apertures with barrier material to prevent ion implantation therethrough and implanting dopant ions of said opposite conductivity type through said closed contour aperture into said semiconductor layer throughout the thickness thereof;

d. uncovering said insulating layer and forming a relatively thin layer of insulating material on semiconductor surface areas within the said further apertures;

e. covering the relatively thin insulating layer in a first one of said further apertures with barrier material to prevent implantation of ions therethrough and implanting ions of said opposite conductivity type through the relatively thin insulating layers in second and third ones of said further apertures to define first and second regions of said opposite conductivity type in said semiconductor layer of one conductivity type;

f. covering the relatively thin insulating layer in said second further aperture with barrier material to prevent implantation of ions therethrough and implanting further ions of said opposite conductivity type through said relatively thin insulating layer in said third further aperture into said second region to decrease the sheet resistance thereof.

5. A method of fabricating an integrated circuit semiconductor device having a semiconductor layer of one conductivity type and an underlying semiconductor layer of opposite conductivity type a portion of said semiconductor layer of one conductivity type defining a collector region for a transistor; comprising the steps of a. forming a layer of insulating material over a surface of said semiconductor layer of one conductivity type;

b. forming a patterned masking layer on said insulating layer and removing portions of said insulating layer in areas defined by said masking layer to open a closed contour aperture in said insulating layer surrounding said collector region and first, second and third self-aligned spaced apertures through said insulating layer surrounded by said closed contour aperture;

c. covering said first, second and third apertures with barrier material to prevent implantation of ions therethrough and implanting ions of said opposite conductivity type into said semiconductor layer of one conductivity type through said closed contour aperture to form an isolation region of said opposite conductivity type extending throughout the thickness of said first layer of one conductivity type;

d. removing said masking layer and barrier material and forming a relatively thin layer of insulating material on surface portions of said semiconductor layer of one conductivity type within said apertures in the insulating layer;

e. covering the relatively thin insulating layer in said first aperture with barrier material to prevent implantation of ions therethrough and implanting ions of said opposite conductivity type into the semiconductor layer of said one conductivity type through said relatively thin thickness layers of insulating material in said second, third and closed contour apertures;

f. covering the relatively thin insulating layers in said first and second apertures in the insulating layer with barrier material to prevent implantation of ions therethrough and introducing further dopant ions of said opposite conductivity type into said semiconductor layer of said one conductivity type through the relatively thin insulating layers in said third and said closed contour apertures whereby said second region of opposite conductivity type defines a resistor region having relatively high sheet resistance and said third region of opposite conductivity type defines a base region of relatively low sheet resistance;

g. exposing surface areas of said semiconductor layer of one conductivity type beneath said first apertures and over a limited area of said third region of opposite conductivity type and introducing impurities of said one conductivity type into said exposed surface areas to define, respectively, a collector contact region and an emitter region for said transistor; and h. retaining said insulating layer in place and forming ohmic connections at least to said resistor, emitter, and collector contact regions through apertures in said insulating layer.

6. A method according to claim 5, wherein said semiconductor substrate comprises a silicon substrate, said insulating layer comprises silicon oxide and said masking layer and said barrier material comprise photoresist material.

7. A method according to claim 6, wherein said one conductivity type is p-type and said opposite conductivity is n-type.

8. In a method of fabricating a semiconductor device having a semiconductor substrate including a layer of insulating material on one surface of said substrate, the steps of:

a. forming a patterned layer on said insulating layer and delineating a plurality of critically spaced areas in said insulating layer in correspondence with said patterned layer, said spaced areas including a closed contour area and at least two areas within the closed contour area;

b. implanting ions into said substrate in a region thereof below said closed contour area to define an isolation region in said substrate;

c. forming reduced thickness insulating material in said spaced areas in the insulating layer within the closed contour area;

d. implanting ions of one conductivity type into said substrate surface through at least one of said reduced thickness areas while covering other of said reduced thickness areas with barrier material to prevent ion implantation therethrough;

e. implanting further ions of said one conductivity type into said substrate surface through at least a further one of said reduced thickness areas while covering other of said reduced thickness areas with barrier material to prevent ion implantation therethrough;

f. and subsequently removing said patterned layer and said barrier material while leaving said insulating layer in place and forming ohmic connections through apertures in said insulating layer at least to selected ones of said ion implanted substrate areas.

9. A method according to claim 8, wherein said step (d) results in implantation of a first doped region in said substrate of a conductivity type opposite from that of said substrate surface, and including the further step of forming a second doped region of the same conductivity type as that of said substrate surface, in said first doped region.

10. A method according to claim 8, wherein said ions implanted through said closed contour area are dopant ions of said one conductivity type.

* * * * *